US009653640B2

(12) United States Patent
Ma et al.

(10) Patent No.: US 9,653,640 B2
(45) Date of Patent: May 16, 2017

(54) METAL-OXIDE-SEMICONDUCTOR FIELD-EFFECT PHOTOTRANSISTORS BASED ON SINGLE CRYSTALLINE SEMICONDUCTOR THIN FILMS

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 40 days.

(21) Appl. No.: 14/879,241

(22) Filed: Oct. 9, 2015

(65) Prior Publication Data
US 2017/0104123 A1 Apr. 13, 2017

(51) Int. Cl.
| H01L 31/00 | (2006.01) |
| H01L 31/113 | (2006.01) |
| H01L 31/101 | (2006.01) |
| H01L 31/0232 | (2014.01) |
| H01L 31/0236 | (2006.01) |
| H01L 31/0224 | (2006.01) |
| H01L 31/0392 | (2006.01) |

(52) U.S. Cl.
CPC ...... *H01L 31/1136* (2013.01); *H01L 31/0236* (2013.01); *H01L 31/02327* (2013.01); *H01L 31/022408* (2013.01); *H01L 31/03921* (2013.01); *H01L 31/03926* (2013.01); *H01L 31/1013* (2013.01)

(58) Field of Classification Search
CPC ............ H01L 31/1136; H01L 31/1013; H01L 31/02327; H01L 31/0236
USPC ....................................... 250/214.1
See application file for complete search history.

(56) References Cited

U.S. PATENT DOCUMENTS

| 4,794,439 A | 12/1988 | Webb et al. |
| 5,494,833 A | 2/1996 | Martin et al. |
| 5,532,173 A | 7/1996 | Martin et al. |
| 6,919,253 B2 * | 7/2005 | Saitoh ............... H01L 29/66242 257/E21.102 |
| 7,354,809 B2 | 4/2008 | Yuan et al. |
| 9,117,940 B2 | 8/2015 | Rogers et al. |
| 2007/0290288 A1 * | 12/2007 | Hsu ..................... H01L 31/1136 257/462 |
| 2007/0295953 A1 * | 12/2007 | Lee ....................... H01L 31/028 257/19 |

OTHER PUBLICATIONS

Ashraf, et al, "Fabrication of polymer-based reflowed microlenses on optical fibre with control of focal length using differential coating technique," (Aug. 2009), Sadhana, vol. 34, Part 4, pp. 607-613.

(Continued)

*Primary Examiner* — Seung C Sohn
(74) *Attorney, Agent, or Firm* — Bell & Manning, LLC (57) ABSTRACT

MOSFET phototransistors, methods of operating the MOSFET phototransistors and methods of making the MOSFET phototransistors are provided. The phototransistors have a buried electrode configuration, which makes it possible to irradiate the entire surface areas of the radiation-receiving surfaces of the phototransistors.

19 Claims, 11 Drawing Sheets

(56) References Cited

OTHER PUBLICATIONS

Hsiao, et al., "Design of anti-ring back reflectors for thin-film solar cells based on three-dimensional optical and electrical modeling," (2014), *Applied Physics Letters,* 105, pp. 061108-1-061108-5.
Jain, et al., "Evaluation of Optically Illuminated Mosfet Characteristics by TCAD Simulation," (Apr. 2013), *International Journal of VLSI Design & Communication Systems* (VLSICS), vol. 4, No. 2, pp. 11-25.
Ji, et al., "Improved antireflection properties of moth eye mimicking nanopillars on transparent glass: flat antireflection and color tuning," (2012), *Nanoscale,* vol. 4, No. 15, pp. 4603-4610.

\* cited by examiner

METAL-OXIDE-SEMICONDUCTOR FIELD-EFFECT PHOTOTRANSISTORS BASED ON SINGLE CRYSTALLINE SEMICONDUCTOR THIN FILMS

REFERENCE TO GOVERNMENT RIGHTS

This invention was made with government support under FA9550-09-1-0482 awarded by the USAF/AFOSR. The government has certain rights in the invention.

BACKGROUND

Photodetectors are indispensable components for most optoelectronic applications due to their ability to convert light signals into electrical signals. Compared with the renowned III-V compound-based photodetectors, silicon (Si)-based photodetectors can be easily integrated with the conventional Si-based complementary-metal-oxide-semiconductor (CMOS) technology. Although conventional p-n and p-i-n photodiodes are popular device structures, they suffer from low responsivity and quantum efficiency. Therefore, it is necessary to boost their electrical signals to an acceptable range via amplifiers.

Metal-oxide-semiconductor field-effect-transistors (MOSFETs) exhibit exceptional photo sensing capability. MOSFET type photodetectors, also known as phototransistors, have the advantages of not only high photo sensitivity and responsivity, but also integrability into conventional CMOS chips. However, some shortcomings still exist due to structural limitations, such as limited light-sensing area and light blocking by gate electrodes. More importantly, these devices are built on rigid substrates, making it difficult to manipulate the physical shapes of the photodetectors.

SUMMARY

MOSFET phototransistors, methods of operating the MOSFET phototransistors and methods of making the MOSFET phototransistors are provided.

One embodiment of a MOSFET phototransistor comprises: a substrate; a single-crystalline semiconductor film comprising: a radiation-receiving surface; an opposing, substrate-facing surface; a source region; a drain region; and a channel region; a gate stack comprising a gate dielectric and a gate electrode, wherein the gate stack is disposed on the substrate-facing surface of the single-crystalline semiconductor film, between the channel region of the single-crystalline semiconductor film and the substrate; a source electrode disposed on the substrate-facing surface of the single-crystalline semiconductor film, between the source region of the single-crystalline semiconductor film and the substrate; a drain electrode disposed on the substrate-facing surface of the single-crystalline semiconductor film, between the drain region of the single-crystalline semiconductor film and the substrate; and an antireflective coating on the radiation-receiving surface of the single-crystalline semiconductor film.

One embodiment of a method of operating the MOSFET phototransistor comprises applying a gate voltage to the gate electrode; and irradiating the radiation-receiving surface of the single-crystalline semiconductor film with incident radiation, whereby charge carriers are created in the single-crystalline semiconductor layer. This results in the modulation of the gate voltage and the drain current in the phototransistor, which can be measured using a current measuring device.

One embodiment of a method for making a MOSFET phototransistor comprises: forming a source region, a drain region, and a channel region in a single-crystalline semiconductor film that is attached to a sacrificial substrate, the single-crystalline semiconductor substrate comprising a first surface and a second surface facing opposite the first surface; releasing the single-crystalline semiconductor film from the sacrificial substrate; forming a source electrode over the source region on the first surface of the single-crystalline semiconductor film; forming a drain electrode over the drain region on the first surface of the single-crystalline semiconductor film; and forming a gate stack comprising a gate dielectric and a gate electrode over the channel region on the first surface of the single-crystalline semiconductor film; attaching the released single-crystalline semiconductor film onto a support substrate, with the source electrode, gate stack, and drain electrode facing the support substrate, such that second surface of the single-crystalline semiconductor film is facing away from the support substrate; and applying an antireflective coating over the second surface of the single-crystalline semiconductor film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 3A-F. Schematic illustration of the process flow for a silicon-based phototransistor in accordance with the Example.

FIG. 5A. W=25 µm, L=2 µm; FIG. 5B. W=50 µm, L=2 µm; FIG. 5C. W=50 µm, L=10 µm; FIG. 5D. W=100 µm, L=10 µm.

DETAILED DESCRIPTION

MOSFET phototransistors, methods of operating the MOSFET phototransistors and methods of making the MOSFET phototransistors are provided.

The phototransistors have a buried electrode configuration, which makes it possible to irradiate the entire surface areas of the radiation-receiving surfaces of the phototransistors, thereby increasing their radiation absorption. The buried electrode configuration can be combined with an antireflective coating on the radiation-receiving surface and radiation-reflective backside electrode to further enhance the performance of the devices—providing them with high light sensitivities and stable performance. Additionally, because the phototransistors can be fabricated from thin transferrable single-crystalline semiconductor films (also referred to as semiconductor nanomembranes) on polymeric substrates, they can be mechanically flexible. As a result, the phototransistors have applications in high performance flexible optical sensors, photodetectors and CMOS imagers.

Figure 1A:
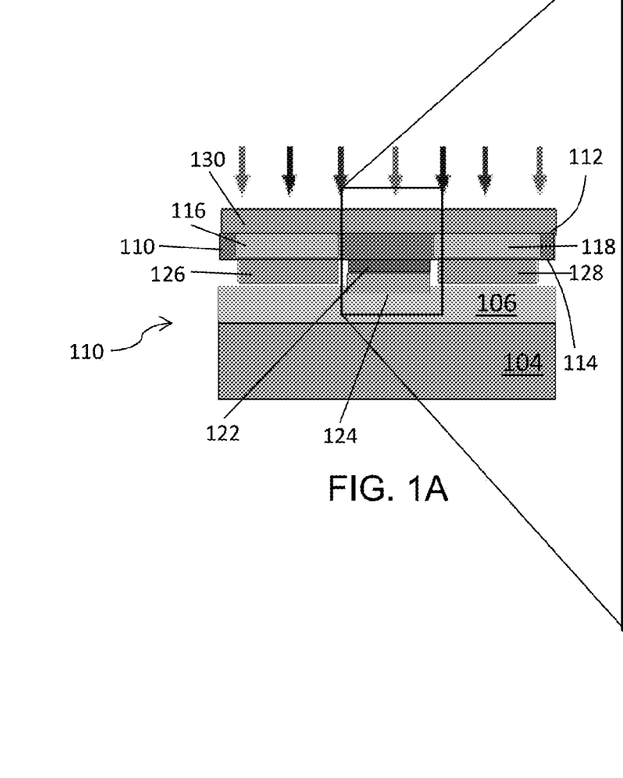
FIG. 1A. Schematic cross-sectional diagram of a metal-oxide-semiconductor field-effect transistor (MOSFET) phototransistor.

An embodiment of a MOSFET phototransistor 100 is shown in FIG. 1A. The phototransistor includes a substrate 102, which supports the active components of the phototransistor. In the embodiment shown here, substrate 102 comprises a base substrate 104 with an adhesive coating 106 on its upper surface. The active region of the phototransistor is comprised of a single-crystalline semiconductor film 110 comprising: a radiation-receiving surface 112; an opposing, substrate-facing surface 114; a source region 116, a drain region 118 and a channel region 120. A gate stack comprising a gate dielectric 122 and a gate electrode 124 is disposed on substrate-facing surface 114 and positioned between semiconductor film 110 and substrate 102. Similarly, a source electrode 126 and a drain electrode 128, disposed on source region 116 and drain region 119, respectively, are positioned between semiconductor film 110 and substrate 102. In this configuration, adhesive coating 106, which may be an epoxy polymer, helps to attach the active components of the phototransistor to base substrate 104. An antireflective coating (ARC) 130 is provided over radiation-receiving surface 112.

Figure 7:
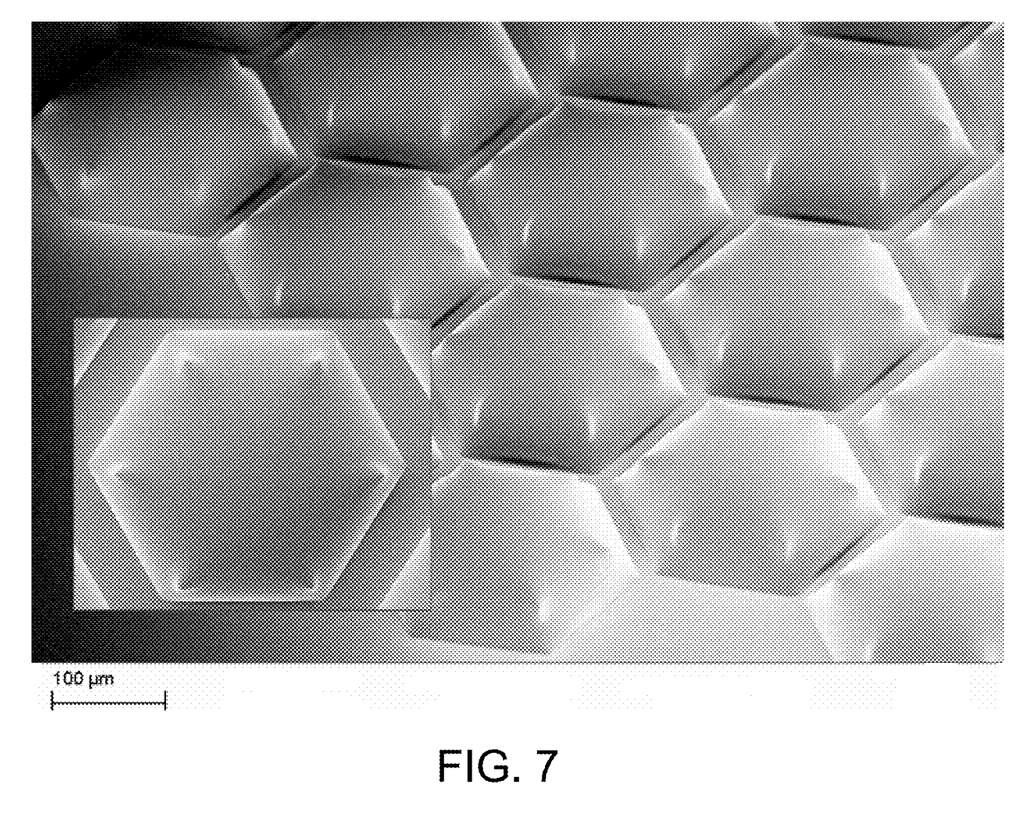
FIG. 7. Image of a polymer lens pattern that can used for a patterned anti-reflection coating.

In some embodiments, the ARC is patterned in order to increase the incident radiation collection efficiency of the phototransistor, relative to the incident radiation collection efficiency of an ARC having planar surfaces. For example, a radiation focusing pattern can be defined into one or both of the upper (radiation-receiving) and lower (semiconductor film-facing) surfaces of the ARC in order to redirect and focus more radiation into the channel region of the phototransistor. For example, the surfaces may be faceted and/or comprise a microscale or nanoscale patterned surface topography, that is—a surface topography having features with one or more dimensions of about 100 µm or less and about 100 nm or less, respectively. Examples of patterns that can be used to increase the radiation collection efficiency include arrays of anti-rings and arrays of nanopillars, including pointed cone-shaped pillars and rounded cone-shaped pillars, as describe in Po-Yuan Chen et al., Opt. Express 22, A1128-A1136 (2014) and Seungmuk Ji et al., Nanoscale, 4, 4603-4610 (2012). Arrays of dome-shaped lenses and nanospheres and Fresnel lenses can also be used. In some embodiments, the pattern comprises a plurality of plano-convex microlenses extending upward from the upper surface of the ARC. Such microlenses can be formed, for example via polymer reflow of a plurality of polymeric microcylinders patterned on or defined in the upper surface of the ARC. By way of illustration, FIG. 7 is an image of a polymer lens array that can be fabricating using a polymer reflow technique.

Figure 1B:
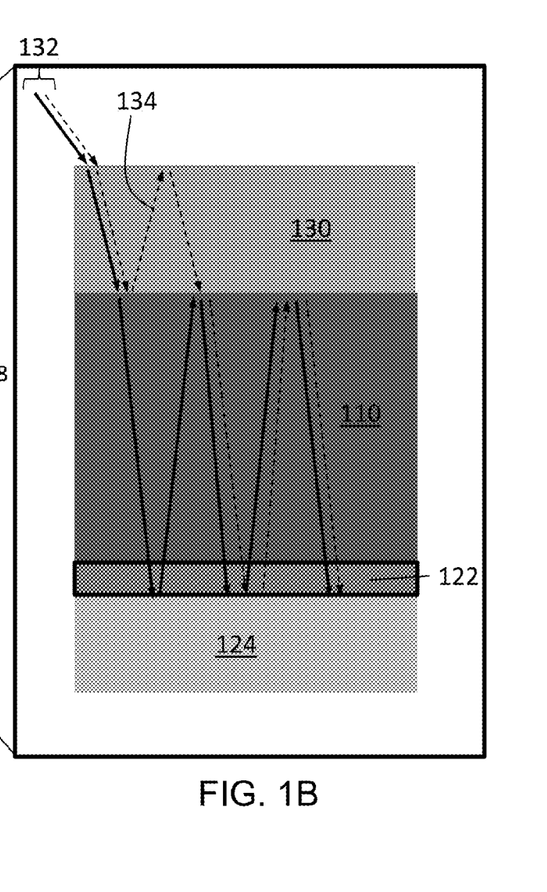
FIG. 1B. Enlarged view of the central portion of the phototransistor of FIG. 1A.

FIG. 1B provides an enlarged view of the central portion of phototransistor 100 and illustrates the role of the ARC and gate electrode in enhancing radiation absorption by semiconductor film 110. As shown in the figure, when incident radiation comprising a plurality of wavelengths 132 impinges on radiation-receiving surface 112, a portion of the incident radiation 134 may be reflected away from semiconductor film 110. However, by including ARC 130 the loss due to reflection can be decreased, as ARC 130 operates to reflect radiation 134 back to radiation-receiving surface 112 of semiconductor film 110.

The ARC material should be selected such that it is optically transparent to the incident radiation to be absorbed by the single-crystalline semiconductor film and has an index of refraction suitable for achieving the desired reflectance. Epoxy polymers are examples of materials that can be used as ARCs. Polymeric ARCs are advantageous because they are mechanically flexible. However, other materials, including inorganic materials, such as indium tin oxide (ITO) may also be employed. The ARC can be quite thin, having a thickness of 1 µm or less, including thicknesses of 0.5 µm or less. However, thicker ARCs can be used.

As shown in FIGS. 1A and 1B, one or more of the source, drain, and gate electrodes can be positioned below the single-crystalline semiconductor layer, such that incident radiation 132 that traverses ARC 130 and single-crystalline semiconductor layer 110 to impinge on an electrode (124, 126 or 128) is reflected back into single-crystalline semiconductor layer 110, where it may be absorbed to produce photogenerated carriers. In order to maximize the reflectance from the electrodes, the electrode material—typically a metal—desirably has a high reflectivity for the incident radiation. In some embodiments of the phototransistors, the electrodes comprise aluminum or silver.

The source and drain regions are formed by selectively doping the single-crystalline semiconductor film, which is itself a doped semiconductor. The MOSFET phototransistors can be n-channel MOSFETs, in which the source and drain regions are formed by n-type doping a p-type single-crystalline semiconductor film. Alternatively, the MOSFET phototransistors can be p-channel MOSFETs, in which the source and drain regions are formed by p-type doping an n-type single-crystalline semiconductor film.

The single-crystalline semiconductor film is desirably sufficiently thin to be mechanically flexible, such that, in conjunction with the other layers and components of the device, it provides a mechanically flexible phototransistor. By way of illustration, in some embodiments of the phototransistors, the single-crystalline semiconductor film has a thickness no greater than 500 nm. This includes embodiments in which the single-crystalline semiconductor film has a thickness no greater than 400 nm and further includes embodiments in which the single-crystalline semiconductor film has a thickness no greater than 300 nm. For example, the thickness of the single-crystalline semiconductor film can be in the range from about 100 nm to about 300 nm.

Suitable semiconductors for the semiconductor film include inorganic Group IV semiconductors, Group III-V semiconductors and Group II-VI semiconductors. The semiconductors may be single element semiconductors, such as silicon and germanium, or may be alloyed or compound semiconductors, such as SiGe, GaAs, InGaAs and InGaP. In addition, the semiconductor thin film may be strained or unstrained and may comprise more than one sublayer, provided at least one sublayer is a single-crystalline semiconductor film. For example, strained multilayer semiconductor films of the type described in U.S. Pat. No. 7,973,336, the disclosure of which is incorporated herein by reference, can be used as the single-crystalline semiconductor film. (Briefly, such strained multilayer semiconductor films comprise a partially compressive strain-relaxed single-crystalline SiGe film sandwiched between a first tensilely strained single-crystalline silicon film and a second tensilely strained single-crystalline silicon film.) The selection of semiconductor material will depend, at least in part, on the phototransistor's desired wavelength range of operation. For example, silicon is photoactive in the UV, visible and near-infrared regions of the electromagnetic spectrum (e.g., from wavelengths around 200 nm to around 1100 nm).

The substrate may be a rigid substrate, such as a semiconductor wafer. However, flexible substrates are preferred for flexible device applications. Examples of flexible substrates include polymeric substrates and thin inorganic substrates. Polyethylene terephthalate is an example of a polymer from which the substrate can be comprised. Other suitable polymers include: polyethylene naphthalate (PEN); polyestersulfone (PES); and polyimide (PI).

In some embodiments, all of the layers and components in the phototransistors are sufficiently thin and/or comprised of sufficiently flexible materials to render the phototransistors mechanically flexible. By way of illustration, the substrate, including any adhesive coating, may have a thickness of no greater than 110 µm and the entire phototransistor from the radiation-receiving surface of the ARC to the bottom surface of the substrate may have a thickness of less than 120 µm. For the purposes of this disclosure, a phototransistor is mechanically flexible if it can be bent to a radius of curvature of 15 mm, without undergoing a decrease in its responsivity of 10% or greater, as measured according to the procedures described in the Example. As illustrated in the Example, some embodiments of the phototransistors are able to bend to a radius of curvature of 15 mm with less than a 5% decrease in responsivity.

Although not shown in FIG. 1A, connections between the electrodes and external circuitry and/or devices can be made from the backside of the phototransistor, through the substrate.

The MOSFET phototransistor operates as follows. When radiation falls on the surface of the semiconductor film, photons having energies greater than the band-gap energy of the semiconductor material, are absorbed. This absorption results in the photogeneration of charge carries (electron/hole pairs), which can travel through the semiconductor film under an intrinsic or externally-applied electric field. The continuous separation of the photogenerated electron-hole pairs produces a photogenerated drain current, the magnitude of which is proportional to the intensity of the incident radiation.

In the phototransistor, the drain current increases under optical illumination because the incident radiation creates excess electron hole pairs in the depletion region. Because of this, a photovoltage develops, which modifies the effective gate bias, enhancing the transistor conductivity and increasing the drain current.

The phototransistors can be operated in two modes. In the first mode, low voltage bias conditions are used to achieve a very high photocurrent to dark current ratio. The parameters of the low voltage conditions will depend on the nature of the particular phototransistor being tested. However, in some embodiments of the phototransistors very high photocurrent to dark current ratios can be achieved using a gate voltage ($V_{GS}$) of about 0.5 V or lower and a drain voltage ($V_{DS}$) of about 50 mV or lower. Using the first mode of operation, photocurrent to dark current ratios of at least $10^3$, at least $10^4$, and at least $10^5$ can be achieved when the photocurrent is measured using visible light as the incident radiation, as illustrated in the Example.

In the second mode, higher bias conditions are used to achieve a high incident radiation responsivity. The parameters of the high voltage conditions will depend on the nature of the particular phototransistor being tested. However, in some embodiments of the phototransistors high responsivities can be achieved using a gate voltage ($V_{GS}$) of about 1 V or higher and a drain voltage ($V_{DS}$) of about 3 V or higher. Using the second mode of operation, responsivities of at least 10 A/W, at least 40 A/W and at least 50 A/W can be achieved, as illustrated in the Example.

Figure 2:
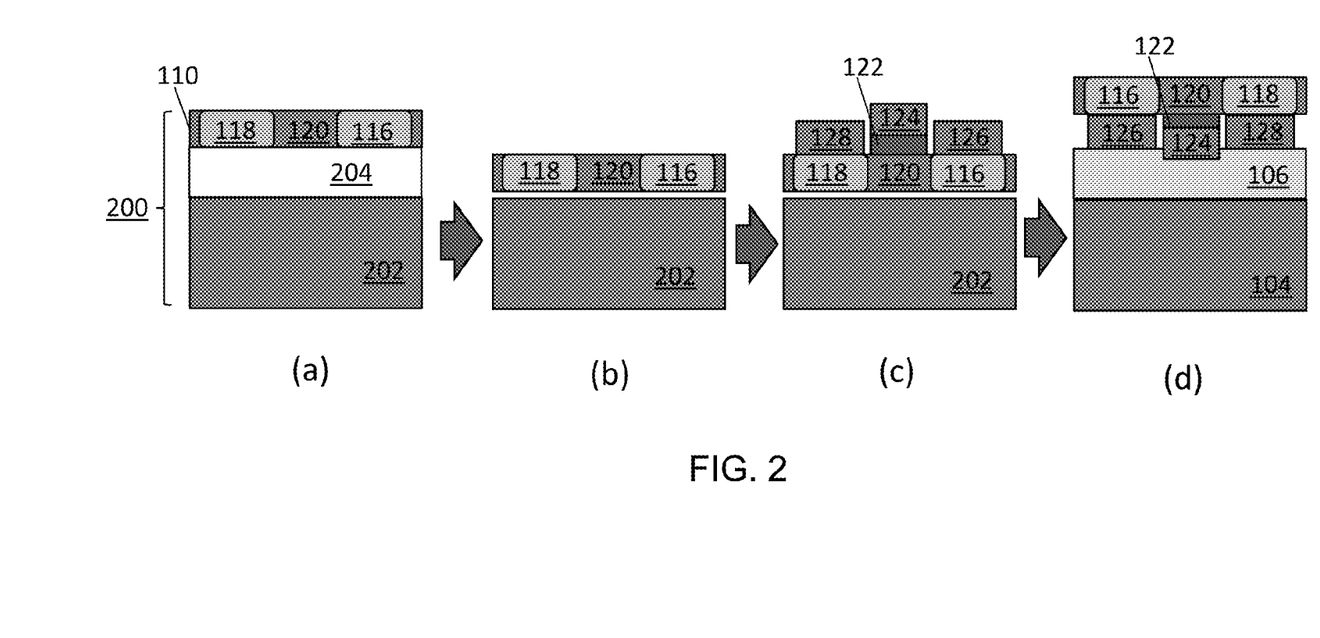
FIG. 2. Schematic diagram of the process flow for the fabrication of the phototransistor of FIG. 1A.

The phototransistors can be fabricated via the release and transfer of single-crystalline semiconductor films grown on sacrificial substrates. For example, they can be fabricated from the device layer of a semiconductor (e.g., Si)-on-insulator (SOI) substrate, wherein the buried oxide of the SOI is used as a sacrificial substrate. The fabrication process is illustrated schematically in FIG. 2. The process begins (step (a)) with an SOI 200 comprising a handle substrate 202, such as a silicon wafer, a sacrificial layer 204, such as a buried silicon oxide layer, and a single-crystalline semiconductor layer 110, into which a source region 116, a drain region 118 and a channel region 120 have been defined via selective doping. Next, sacrificial layer 204 is removed (for example, chemically etched away) to release semiconductor film 110 (step (b)). A source electrode 126 and a drain electrode 128 are deposited on source region 116 and drain region 118, respectively. A gate stack comprising a gate oxide 122 and a gate electrode 124 is formed on channel region 120 (step (c)). The released device is then transferred—electrode and gate stack side-down—onto a support substrate 104, which includes an adhesive coating 106 on its upper surface (step (d)). As a result, the radiation-receiving surface 112 of single-crystalline semiconductor film 110 can be fully exposed to incident radiation, without any radiation blocking from the source and drain electrodes, the gate stack, or any other device components. Once semiconductor film 110 is released and transferred away from handle substrate 202, another layer of sacrificial material can be grown on its newly exposed surface. Then the process can be repeated to fabricate another MOSFET. In this manner, the wafer substrate can be continually recycled in the fabrication of a plurality of MOSFETs.

EXAMPLE

In this Example, flexible phototransistors with a back gate configuration based on transferrable single-crystalline Si nanomembrane (Si NM) are demonstrated. Having the Si NM as the top layer enables full exposure of the active region to incident light and, thus, allows for effective light sensing. The flexible phototransistors operate in two modes: (1) the high light detection mode, which exhibits a photo-to-dark current ratio of $10^5$ at voltage bias of $V_{GS}$<0.5 V and $V_{DS}$=50 mV; and (2) the high responsivity mode, which shows a maximum responsivity of 52 A/W under blue illumination at voltage bias of $V_{GS}$=1 V and $V_{DS}$=3 V. Due to the good mechanical flexibility of Si NMs, with the assistance of a polymer layer to enhance light absorption, the device exhibited stable responsivity with less than 5% variation under bending at small radii of curvatures (up to 15 mm). The flexible phototransistors with the capabilities of high sensitivity light detection and stable performance under the bending conditions can be used in high performance flexible optical sensor applications, with easy integration for multi-functional applications.

This Example illustrates the fabrication and performance characteristics of thin-film transistor type flexible phototransistors using single-crystalline Si NMs. The phototransistors were designed to maximize light sensing by the flip transfer of the Si NM layer, the gate stack, and source/drain electrodes (resulting in a geometry that is referred to herein as a silicon-on-top structure). In this structure, unlike other MOSFET-type photodetectors, light-absorption in a Si NM layer can be much more efficient because light is not blocked by any metal layers or other materials. Also, the active region, where light is detected, is not limited by channel dimension. Moreover, electrodes placed underneath the Si NM also acted as light reflectors to further improve light absorption. These design merits led to very high responsivity, despite the use of thin Si NMs (i.e., only 270 nm). Overall, the flexible Si NM phototransistors exhibited not only a sufficient light/dark current ratio when working at a very low voltage bias, but also very high responsivity when working at a normal operation voltage bias.

Results and Discussion

The schematic illustration of the device fabrication is shown in FIG. 3. The fabrication details can be found in the experimental section, but in short, the process began with n+ doping the top Si device layer of a SOI wafer (SOITEC) to define source and drain regions (FIG. 3A), followed by release of the top Si device layer (Si NM) (FIG. 3B). Gate and source/drain electrodes were deposited by e-beam evaporation (FIG. 3C). After the metallization step, all of the device layers (metal electrodes and Si NM) were flip transferred on to an adhesive layer (SU-8 2002, Microchem) coated on a polyethylene terephthalate (PET) substrate and cured (FIG. 3D). The active layer was defined (FIG. 3E) and covered by an anti-reflection coating (ARC) layer (SU-8 2002). The ARC layer has a refractive index (n) between 1.57 and 1.65 for visible light with the average optical transmittance in the visible range of nearly 97%. (See, P. Krogstrup, H. I. Jørgensen, M. Heiss, O. Demichel, J. V. Holm, M. Aagesen, J. Nygard A. F. i Morral, *Nature Photon.* 2013, 7, 306-310 and MicroChem, SU-8 2000.5-2015 Data Sheet, http://www.microchem.com/Prod-SU82000.htm.) Thus, it reduces light reflection and enhances light transmission into the Si NM and, consequently, improves light absorption by the Si NM. Detailed descriptions on the transfer printing process and ion implantation can be found elsewhere. (See, W. Zhou, D. Zhao, Y.-C. Shuai, H. Yang, S. Chuwongin, A. Chadha, J.-H. Seo, K. X. Wang, V. Liu, Z. Ma, S. Fan, *Prog. Quant. Electron.* 2014, 38, (1) 1-74.) Shown in FIG. 3F is a micrograph of the fabricated phototransistor. It can be clearly seen that the Si NM, where light is sensed, lies on top of the gate stack and the source/drain electrodes. Therefore, the incident light is not blocked by any of these layers.

Figure 4A:
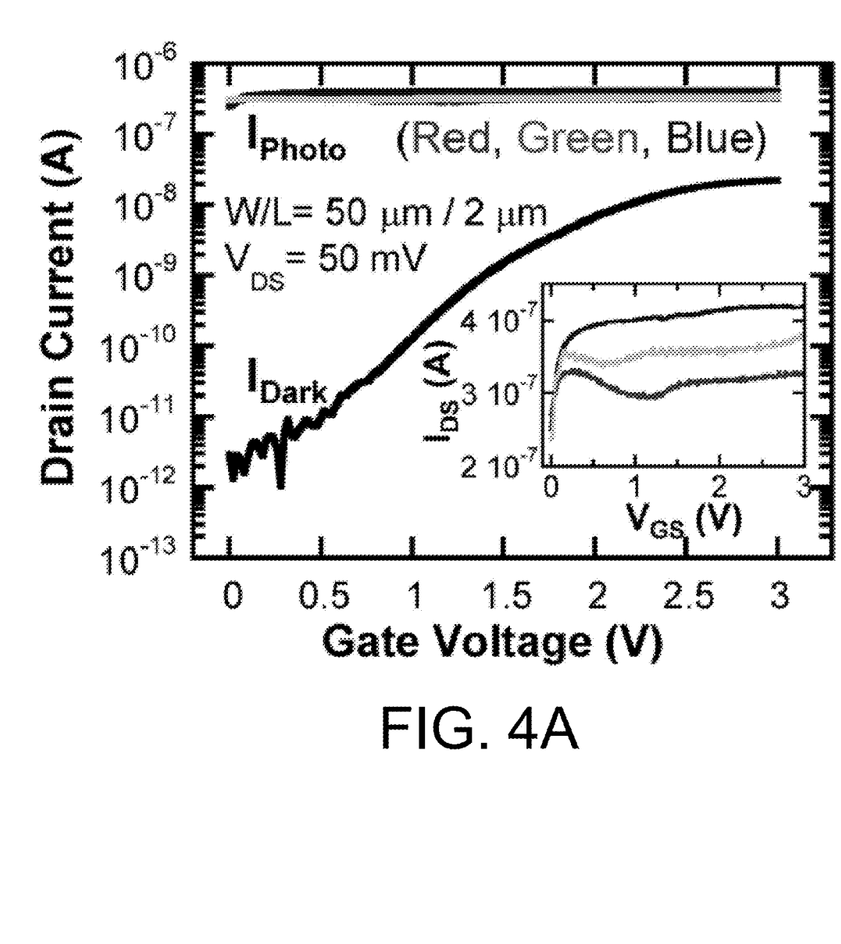
FIG. 4A. Drain current-gate voltage characteristics ($I_{DS}$-$V_{GS}$) at $V_{DS}$=0 V for the phototransistor of the Example. Inset shows the magnified plot of photo currents.

The light sensing characteristics were measured under dark and illuminated conditions by using representative Si NM phototransistors, which had a channel width and channel length of 50 μm and 2 μm, respectively. As shown in FIG. 4A, the phototransistor can be operated in two different modes: the first mode is for high photo-to-dark current ratio, achieved by operating under low voltage biases; and the second mode is for high responsivity, achieved under high voltage biases. In the first mode, the phototransistors showed extremely low dark current (<10 pA) and high photocurrent (i.e., drain current) (>0.4 μA) under very low voltage bias ($V_{GS}$<0.5 V, and $V_{DS}$=50 mV) which yielded a photo-to-dark current ratio of up to $10^5$. As gate bias increased, the transistor current substantially increased, due to the transistor effect, and the photo-to-dark current ratio thus decreased to 11. This indicates that the devices are suitable for operation in the first mode under very low bias. The very high photo-to-dark current ratio is attributed to the silicon-on-top structure, better light absorption with the SU-8 ARC layer, and the use of the metal electrodes as backside reflectors.

To prove the effectiveness of light absorption enhancement of the ARC and the metal electrode reflectors, optical simulations were performed. FIG. 4D shows the simulated light absorptions of the Si NM in the visible wavelength range (400 nm~700 nm) before adding any light absorption-assisting layers (Case 1), after applying the metal electrode as a reflector (Case 2), and after applying both the SU-8 ARC layer and the metal electrode reflector (Case 3). The three cases are illustrated schematically in FIG. 4C. It should be noted that the simulations were performed based on the actual layer thicknesses and optical parameters. The averaged light absorption of the Si NM in the visible wavelength region nearly doubled, from 20.2% to 38.3%, with the metal reflector on the backside of the Si NM. In addition, the SU-8 ARC layer on top of the Si NM further enhanced its average light absorption from 38.3% to 48%, which is equivalent to using a 480 nm thick Si NM. Particularly, light absorption of blue, green, and red wavelengths by the Si NM increased from 44%, 20%, and 5% to 99%, 99%, and 40%, respectively, by adding the metal reflector and the ARC layer.

Figure 4B:
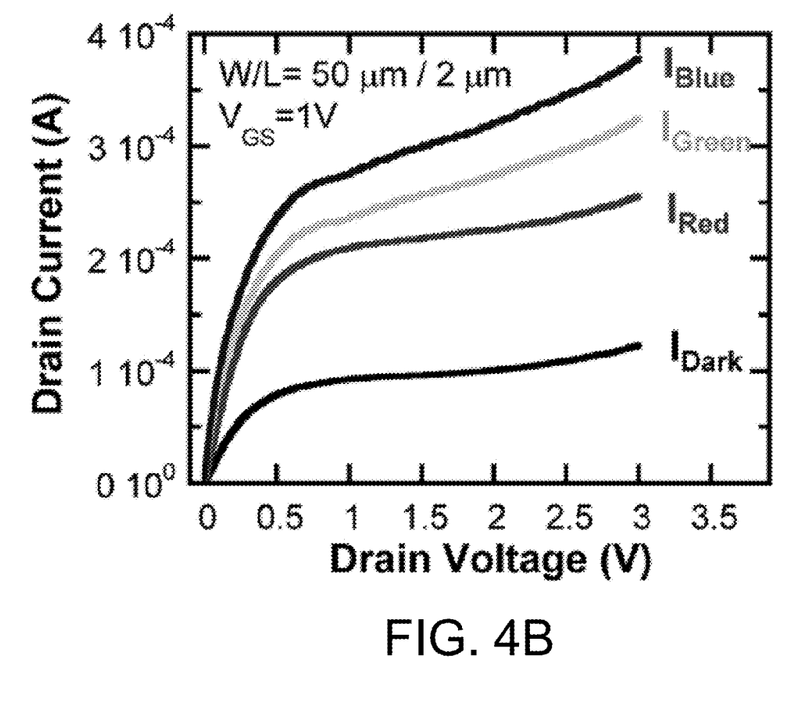
FIG. 4B. Drain current-drain voltage characteristics ($I_{DS}$-$V_{GS}$) under dark and illumination with various light sources (red, green, and blue) illuminating the flexible phototransistors. The $I_{DS}$-$V_{GS}$ curve under $V_{GS}$=1 V shows a photo-to-dark current ratio as high as ~1×10$^5$.
Figure 4C:
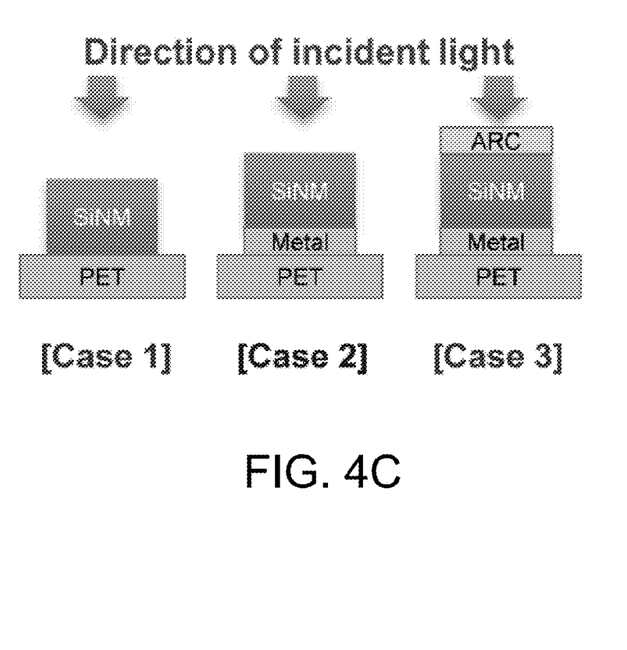
FIG. 4C. Three layer structures used to simulate the light absorption of the Si NM of the phototransistor.
Figure 4D:
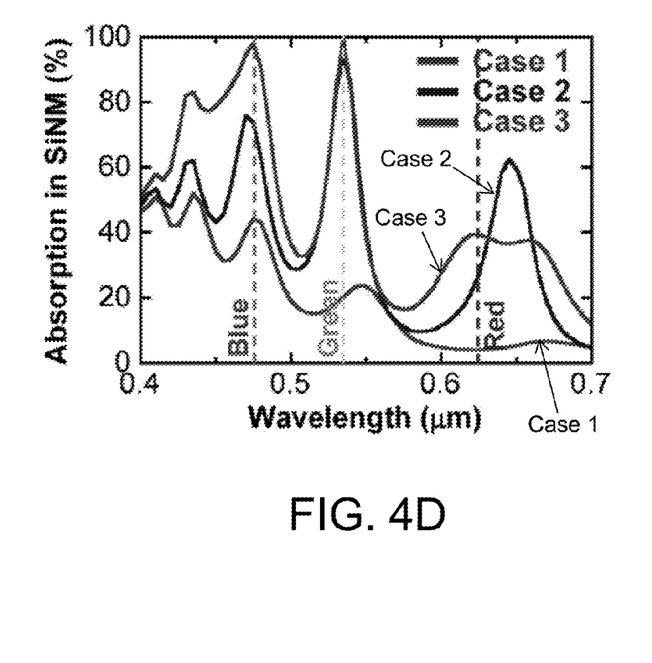
FIG. 4D. The corresponding simulated absorption of the Si NM: (i) without any layers; (ii) with the metal reflector underneath the Si NM; and (iii) with the metal reflector underneath the Si NM and SU-8 ARC layer on top of Si NM, respectively. Dashed line denotes blue (473 nm), green (532 nm), and red (632 nm) wavelengths.
Figure 5A:
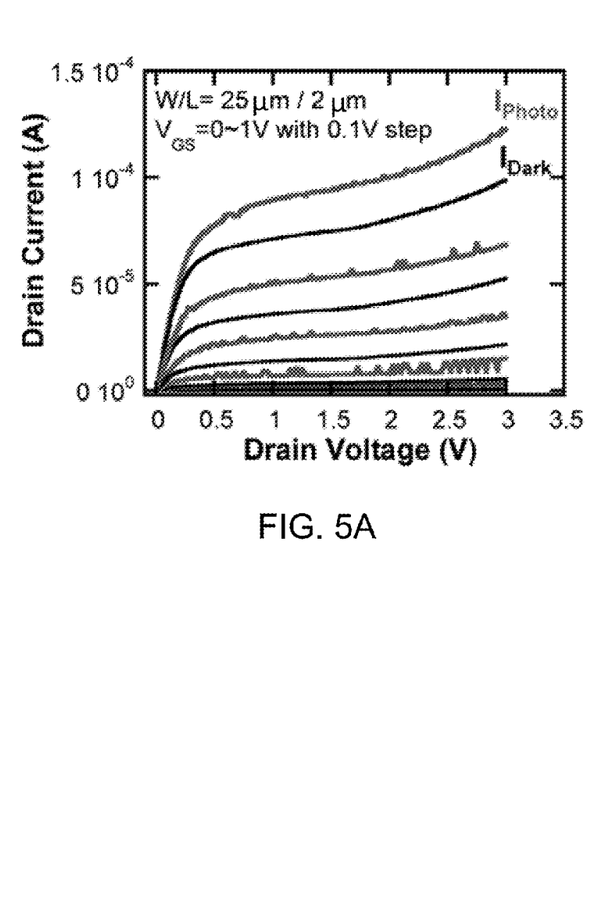
FIG. 5A-D. Drain current-drain voltage characteristics ($I_{DS}$-$V_{DS}$) with different $V_{GS}$ biases ranging from 0 to 1 V with a 0.1 V step under the dark and the green light illumination of flexible phototransistors in the Example, which have different W/L ratios.
Figure 5B:
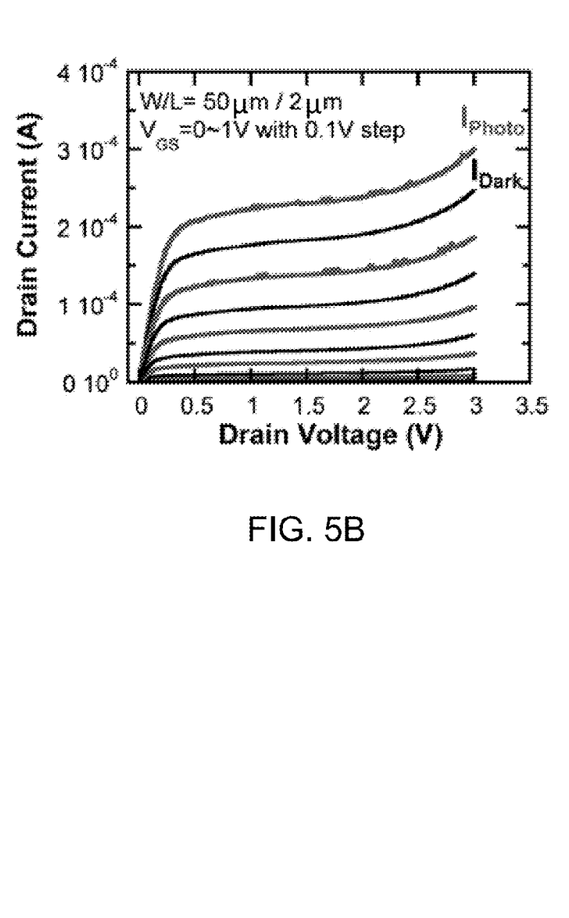
Figure 5C:
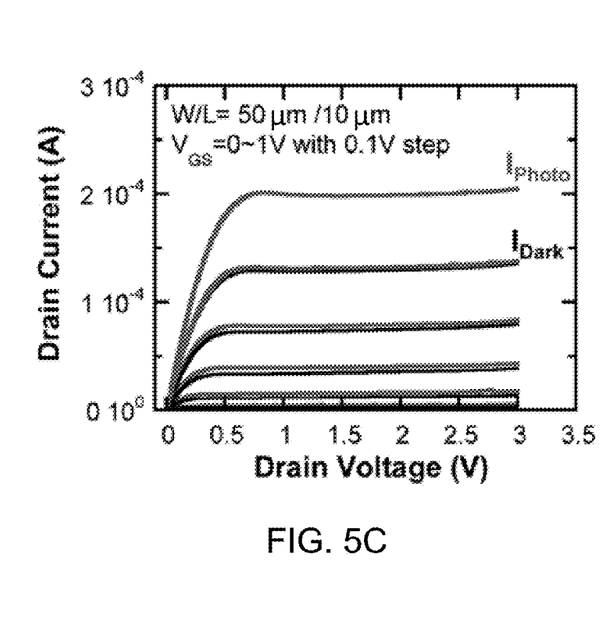
Figure 5D:
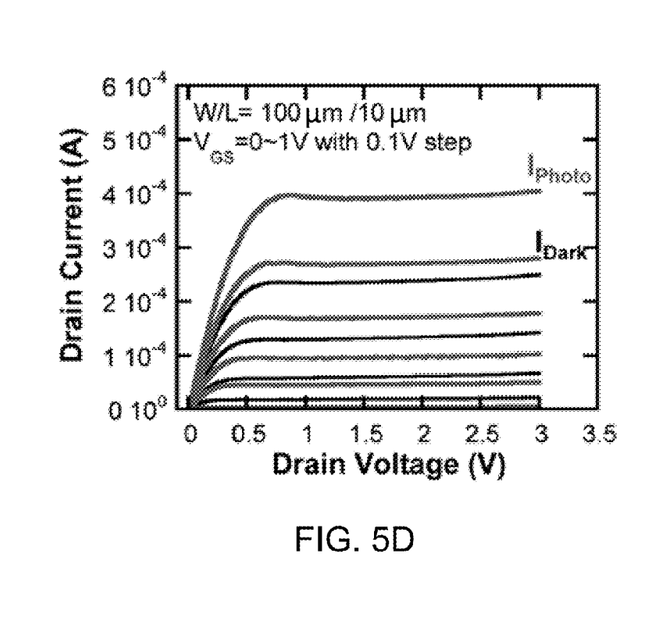

In FIG. 4B, $I_{DS}$-$V_{DS}$ characteristics under red, green, and blue laser illumination are shown. When the phototransistors were biased at higher voltages, they operated in the second mode, where high responsivity was achieved. Responsivity "R" in phototransistors can be calculated from the equation: (1) R=$I_{ph}$/$P_{inc}$ $I_{ph}$/(E=A), where $I_{ph}$ is the photocurrent, $P_{inc}$ is the light power incident onto the active region of the device, E is the irradiance of the incident light (power intensity), and A is the area of the active region. (See, Z. Huang, J. E. Carey, M. Liu, X. Guo, E. Mazur, J. C. Campbell, *Appl. Phys. Lett.* 2006, 89, 033506.) According to Eq. (1), when the incident light was reflected back to the active region by the bottom metal reflector and the top ARC layer, the light absorption by the active region nearly doubled, which is equivalent to half of the P value. Therefore, the enhanced light absorption in the active region is a major factor in the improved responsivity of the devices. In this calculation, ~4 mW/mm² of E and 2000 μm² of A were used. It should be noted that the area of the active region refers to the top surface area of the entire Si NM, including the channel region and contact region, due to the Si NM-on-top structure. The responsivity at a voltage bias of $V_{GS}$=1 V and $V_{DS}$=3 V under red, green, and blue light illumination were calculated to be 51, 41, and 18 A/W, respectively. It should be noted that the responsivity under low gate bias, which is the first mode, was only 0.04 A/W. Considering the responsivity value of ~1 A/W from an amorphous Si phototransistor deposited on a glass substrate having a similar layer thickness to our Si NM phototransistor (see, Y. Vygranenko, A. Nathan, M. Vieira, and A. Sazonov, *Appl. Phys. Lett.* 2010, 96, 173507), these responsivity values are relatively high considering the thin Si NM used in the device. The increasing spectral responsivities at decreasing wavelengths of light may be attributed to the increase in absorption coefficients of Si in the visible light range. To investigate the effect on photocurrent with various dimensions in the Si NM active regions, phototransistors with different channel areas (W/L=25/2 µm, 50/2 µm, 50/10 µm, 100/10 µm) were measured under dark and green light illumination conditions (532 nm), as shown in FIG. 5A, FIG. 5B, FIG. 5C and FIG. 5D, respectively. As expected from the equation: (2) $I_D = 0.5 \mu \cdot \mu \cdot C_{ox} \cdot (W/L) \cdot (V_{GS} - V_t)^2$, where W and L are the channel width and length, the devices with larger W/L ratios showed higher photocurrents. (See, S. M. Sze and K. K. Ng, Physics of Semiconductor Devices, 3rd ed. (Wiley, New York, 2006).) It was also observed that the devices with larger L values showed better light sensitivity, if the W/L ratio was fixed. As shown in the devices of FIG. 5A and FIG. 5D, which have similar W/L ratios, the device with L=10 µm showed 2.35 times the photo-to-dark current increment at $V_{GS}$=1 V and $V_{DS}$=3 V, while the device with L=2 µm only showed 1.3 times the increment.

Figure 6A:
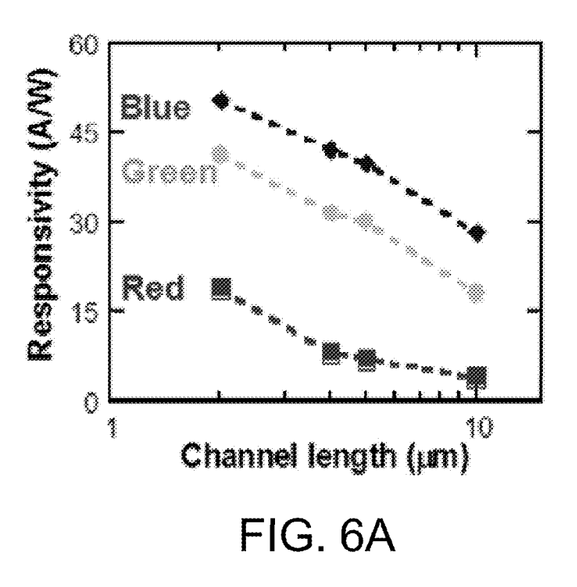
FIG. 6A. The trend of responsivity with respect to channel lengths from 2 to 10 µm for the phototransistor of the Example. The channel width and bias point was fixed at 50 µm and at $V_{GS}$=1 V and $V_{DS}$=3 V.
Figure 6B:
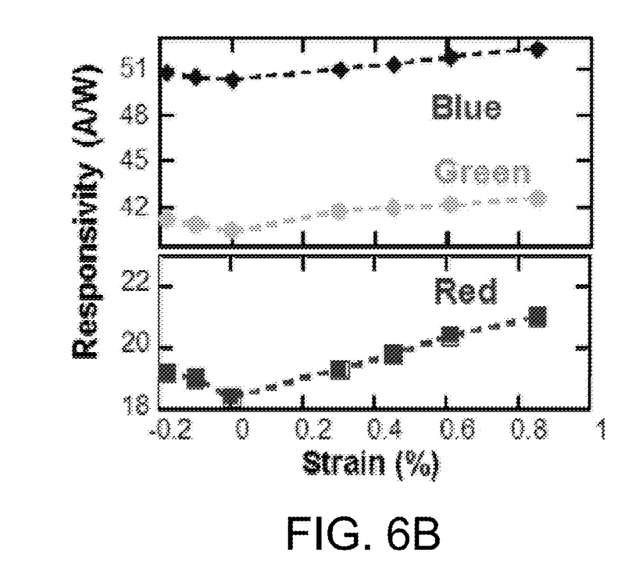
FIG. 6B. Responsivity under bending conditions measured at a fixed voltage bias point of $V_{GS}$=1 V and $V_{DS}$=3 V.
Figure 6C:
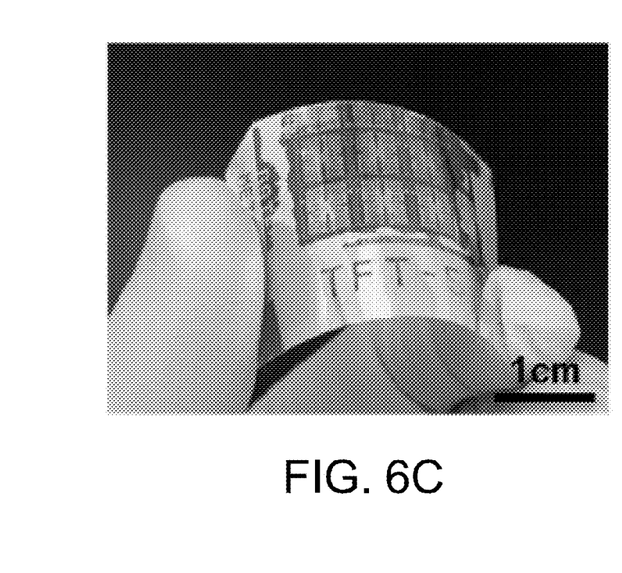
FIG. 6C. An optical image of the flexible Si NM phototransistor on a bent substrate.

The responsivities under red, green, and blue light illumination as a function of channel length are shown in FIG. 6A. Responsivities decreased with an increase in channel length from 2 µm to 10 µm. The trend agrees well with the relationship between the channel current and the responsivity given by Eq. (3): $R = 0.5 \cdot \mu \cdot C_{ox} \cdot (V_{GS} - V_{th})^2 / (L^2 \cdot P)$, by incorporating Eq. (1) and Eq. (2). Therefore, the device with a smaller channel length was more suitable for the second operation mode, which is for high responsivity. FIG. 6B shows the responsivity measured using red (632 nm), green (532 nm), and blue (473 nm) laser sources under the bending condition of external uniaxial strains of 1.08% and 0.2% for tensile and compressive strain, respectively (measured from bending curvature). An optical image of the flexible Si NM phototransistor on a bent substrate is shown in FIG. 6C. The responsivities were measured from the device whose W/L was 50/2 µm under green light. It is speculated that the increase in the responsivity is attributed to the mobility enhancement in the crystal structure of the Si NM. The bendable characteristics of the phototransistors make them suitable for a number of important applications, such as wide view angle imaging.

Figure 6D:
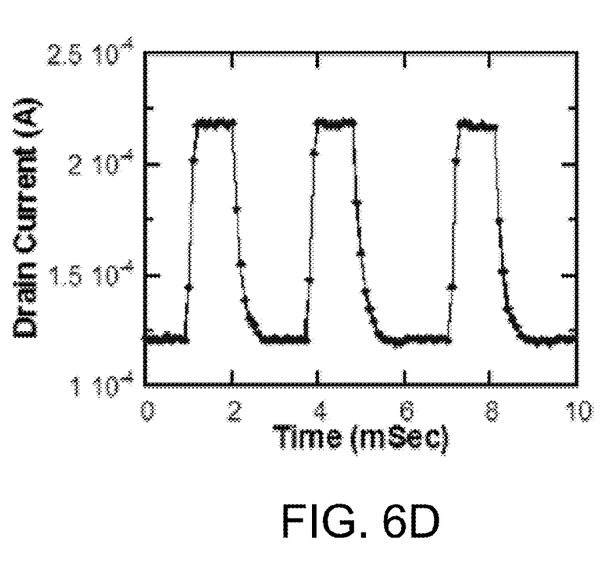
FIG. 6D. Modulated photocurrent under pulsed 5 mW green laser measured at a fixed voltage bias of $V_{GS}$=1 V and $V_{DS}$=3 V.

The drain current as a function of time is shown in FIG. 6D. A 1 millisecond (msec) pulse mode green laser was used as a light source and the waveform was recorded by a digital oscilloscope (Tektronics TDS1000C). We used the same device and light sources for the bending experiment. The device showed 0.05 msec and 0.11 msec rise and fall times. No overshooting and oscillating were observed.

Figure 3A:
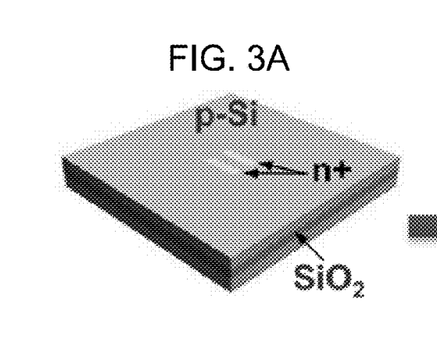
FIG. 3A. Formation of $n^+$ wells by ion implantation to define the source/drain regions to achieve an ohmic contact.
Figure 3B:
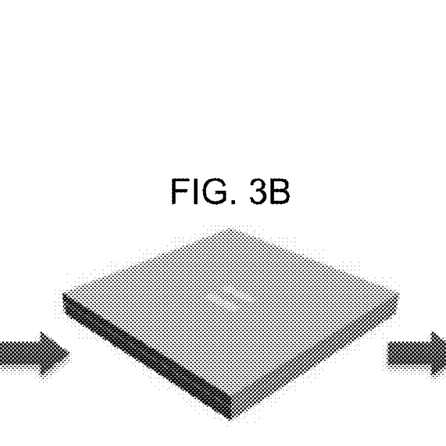
FIG. 3B. Release of the silicon nanomembrane (Si NM) by selective etching of a buried oxide layer.
Figure 3C:
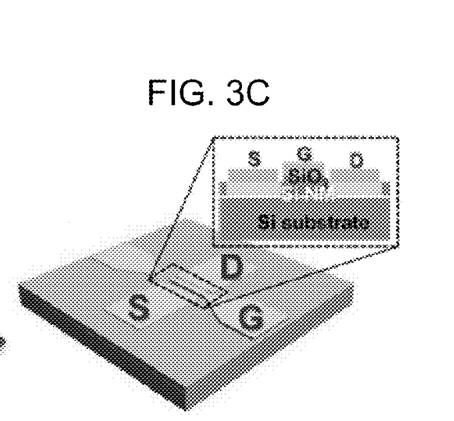
FIG. 3C. Metallization by e-beam evaporation to deposit source/drain electrodes, and a gate stack comprising a gate electrode and gate dielectric.
Figure 3D:
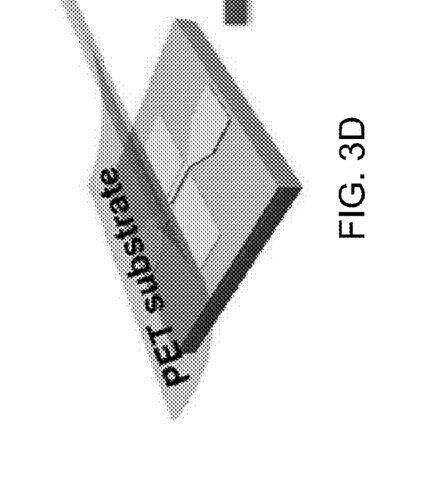
FIG. 3D. Transfer printing of a fully fabricated device onto an adhesive layer-coated PET substrate, FIG. 3E. Spin-coating of a protective, antireflection layer on top of the radiation-receiving surface.
Figure 3E:
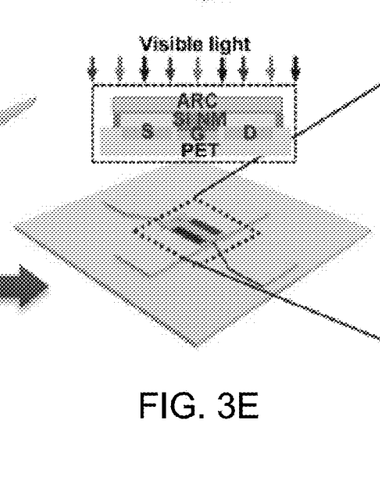
Figure 3F:
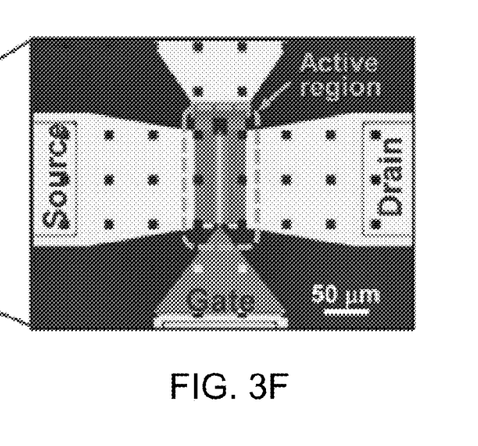
FIG. 3F. Microscopic image of the finished flexible phototransistor. Insets in FIGS. 3C and 3E depict the cross-sectional view of device.

Experimental Section
Device Fabrication:
The fabrication began with an SOI wafer (SOITEC) which had a 270 nm lightly p-type doped (boron, ~1×10$^{15}$ cm$^{-3}$) top Si device layer and a 200 nm buried oxide layer. Two n$^+$ well regions (~8×10$^{19}$ cm$^{-3}$) were formed by phos-phorous ion implantation, followed by a diffusion process at 850° C. for 40 minutes (FIG. 3A). After forming holes through the top Si device layer, now called the Si NM, it was released from the buried oxide layer by selective wet-etching in concentrated HF (49%). The released top Si NM gently fell down onto the handling Si substrate (FIG. 3B). After rinsing and drying the sample, the Si NM was weakly bonded to the handling Si substrate via Van der Waals forces. Gate stack (SiO$_2$/Ti/Au 100 nm/20 nm/80 nm) and source/drain electrodes (Ti/Au 20 nm/180 nm) were patterned using e-beam lithography and deposited by e-beam evaporation (FIG. 3C). After the completion of the metallization step, all of the device layers (metal electrodes and Si NM) were flip transferred to an 0.6 µm thick adhesive layer (SU-8 2002, Microchem) coated on a polyethylene terephthalate (PET) substrate, and cured to glue the devices onto the PET substrate (FIG. 3D). After the transfer step, the Si NM layer was positioned face-up and the electrodes were buried underneath the Si NM. The active layer was defined by the photoresist patterning and dry etching steps (FIG. 3E). Finally, the entire device was covered by an anti-reflection coating (ARC) layer (SU-8 2002).

Improved Transfer Printing Method:
With the conventional transfer printing technique, the semiconductor nanomembrane can be transferred on either a flat or a curvy surface with a yield of nearly 100%. (See, J. A. Rogers, T. Someya, and Y. Huang, *Science* 2010, 327, 5973 and J. A. Rogers, M. G. Lagally, and R. G. Nuzzo, *Nature* 2011, 477, 45.) However, the position of the transferred semiconductor nanomembrane can be slightly changed during the fabrication process due to the different thermal expansions between the plastic substrate and the adhesion layer. (See, L. Sun, G. Qin, J.-H. Seo, G. K. Celler, W. Zhou, Z. Ma, *Small* 2010, 6, (22), 2553-2557.) The improved transfer printing technique we used in this work, i.e. releasing a Si nanomembrane and then transfer printing the finished devices, enables one to avoid such issues effectively. The critical parameter in order to use this method is to have a thin buried oxide layer, so as to increase the Van der Waals force to hold the released Si nanomembrane during the rest of fabrication process. It was discovered that the new method can be used for a BOX layer with a thickness thinner than 200 nm.

Device Characterization:
I-V characteristics of the fabricated devices under dark and illumination were measured using a semiconductor parameter analyzer (HP4155B). The photosensitivity of the devices was also characterized using three different laser sources (473 (blue), 532 (green), and 632 nm (red) wavelengths) with the same power intensity of 4 mW/mm$^2$.

Simulation of Absorption in Si NM:
The simulation was carried out by using a three-dimensional finite-difference time-domain (3D FDTD) technique in the visible light region (400 nm to 700 nm) where the refractive indices of Si NM and SU-8 used in the simulation were 3.48 and 1.57-1.65 for visible light wavelength, respectively. For simplicity and numerical expediency, we limited the study to surface normal incidence. We also assumed that the size and thickness of designed pattern were same as the size of the active region.

The word "illustrative" is used herein to mean serving as an example, instance, or illustration. Any aspect or design described herein as "illustrative" is not necessarily to be construed as preferred or advantageous over other aspects or designs.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A metal-oxide-semiconductor field-effect phototransistor comprising:
    a substrate;
    a single-crystalline semiconductor film comprising: a radiation-receiving surface; an opposing, substrate-facing surface; a source region; a drain region; and a channel region;
    a gate stack comprising a gate dielectric and a gate electrode, wherein the gate stack is disposed on the substrate-facing surface of the single-crystalline semiconductor film, between the channel region of the single-crystalline semiconductor film and the substrate;
    a source electrode disposed on the substrate-facing surface of the single-crystalline semiconductor film, between the source region of the single-crystalline semiconductor film and the substrate;
    a drain electrode disposed on the substrate-facing surface of the single-crystalline semiconductor film, between the drain region of the single-crystalline semiconductor film and the substrate; and
    an antireflective coating on the radiation-receiving surface of the single-crystalline semiconductor film.

2. The phototransistor of claim 1, wherein at least one of the source electrode, gate electrode and drain electrode is configured to reflect radiation that traverses the single-crystalline semiconductor film back into the single-crystalline semiconductor film.

3. The phototransistor of claim 2, wherein each of the source electrode, gate electrode and drain electrode are configured to reflect radiation that traverses the single-crystalline semiconductor film back into the single-crystalline semiconductor film.

4. The phototransistor of claim 1, wherein the substrate is a polymeric substrate and the phototransistor is mechanically flexible.

5. The phototransistor of claim 1, wherein a surface of the substrate in contact with the source electrode, gate electrode and drain electrode comprises an adhesive coating.

6. The phototransistor of claim 1, wherein the antireflective coating and the adhesive coating both comprise an epoxy polymer.

7. The phototransistor of claim 1, wherein the antireflective coating defines a pattern configured to increase the incident radiation collection efficiency of the phototransistor, relative to the incident radiation collection efficiency provided by an unpatterned antireflective coating.

8. The phototransistor of claim 7, wherein the substrate is a mechanically flexible, polymeric substrate.

9. The phototransistor of claim 8, wherein a surface of the substrate in contact with the source electrode, gate electrode and drain electrode comprises an adhesive coating.

10. The phototransistor of claim 1, wherein the single-crystalline semiconductor film is a single-crystalline Group IV semiconductor film.

11. The phototransistor of claim 10, wherein the single-crystalline semiconductor film is a single-crystalline silicon film.

12. The phototransistor of claim 1, wherein the single-crystalline semiconductor film has a thickness of no greater than 400 nm.

13. The phototransistor of claim 1, wherein the source electrode, gate electrode, and drain electrode comprise aluminum or silver.

14. A method of controlling the drain current in a metal-oxide-semiconductor field-effect phototransistor comprising:
    a substrate;
    a single-crystalline semiconductor film comprising: a radiation-receiving surface; an opposing, substrate-facing surface; a source region; a drain region; and a channel region;
    a gate stack comprising a gate dielectric and a gate electrode, wherein the gate stack is disposed on the substrate-facing surface of the single-crystalline semiconductor film, between the channel region of the single-crystalline semiconductor film and the substrate;
    a source electrode disposed on the substrate-facing surface of the single-crystalline semiconductor film, between the source region of the single-crystalline semiconductor film and the substrate;
    a drain electrode disposed on the substrate-facing surface of the single-crystalline semiconductor film, between the drain region of the single-crystalline semiconductor film and the substrate; and
    an antireflective coating on the radiation-receiving surface of the single-crystalline semiconductor film;
    the method comprising:
    applying a gate voltage to the gate electrode; and
    irradiating the radiation-receiving surface of the single-crystalline semiconductor film with incident radiation, whereby charge carriers are created in the single-crystalline semiconductor layer, which modulates the gate voltage and the drain current in the phototransistor.

15. The method of claim 14, wherein the photocurrent to dark current ratio of the phototransistor is at least $10^4$.

16. The method of claim 14, wherein the phototransistor has a responsivity of at least 40 A/W.

17. A method of fabricating a metal-oxide-semiconductor field-effect phototransistor, the method comprising:
    forming a source region, a drain region, and a channel region in a single-crystalline semiconductor film that is attached to a sacrificial substrate, the single-crystalline semiconductor substrate comprising a first surface and a second surface facing opposite the first surface;
    releasing the single-crystalline semiconductor film from the sacrificial substrate;
    forming a source electrode over the source region on the first surface of the single-crystalline semiconductor film; forming a drain electrode over the drain region on the first surface of the single-crystalline semiconductor film; and forming a gate stack comprising a gate dielectric and a gate electrode over the channel region on the first surface of the single-crystalline semiconductor film;
    attaching the released single-crystalline semiconductor film onto a support substrate, with the source electrode, gate stack, and drain electrode facing the support substrate, such that second surface of the single-crystalline semiconductor film is facing away from the support substrate; and applying an antireflective coating over the second surface of the single-crystalline semiconductor film.

18. The method of claim 17, wherein the support substrate is a polymeric substrate and the phototransistor is mechanically flexible.

19. The method of claim 17, wherein the antireflective coating defines a pattern configured to increase the incident radiation collection efficiency of the phototransistor, relative to the incident radiation collection efficiency provided by an unpatterned antireflective coating.

* * * * *

UNITED STATES PATENT AND TRADEMARK OFFICE
CERTIFICATE OF CORRECTION

| | | |
|---|---|---|
| PATENT NO. | : 9,653,640 B2 | Page 1 of 1 |
| APPLICATION NO. | : 14/879241 | |
| DATED | : May 16, 2017 | |
| INVENTOR(S) | : Zhenqiang Ma et al. | |

It is certified that error appears in the above-identified patent and that said Letters Patent is hereby corrected as shown below:

In the Specification

Column 8, Line 53:
Delete "(1) R=$I_{ph}/P_{inc}$ $I_{ph}$(E=A)" and replace with --(1) R = $I_{ph}$ / $P_{inc}$ = $I_{ph}$ / (E × A)--

Column 9, Line 22:
Delete "(2) $I_D$=0.5μ · μ$C_{ox}$ · (W/L) · ($V_{GS}$-Vt)$^2$" and replace with
--(2) $I_D = 0.5 \cdot \mu \cdot C_{ox} \cdot (W/L) \cdot (V_{GS} - V_t)^2$--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*